United States Patent [19]
Holland et al.

[11] Patent Number: 5,617,367
[45] Date of Patent: Apr. 1, 1997

[54] CONTROLLING SYNCHRONOUS SERIAL ACCESS TO A MULTIPORT MEMORY

[75] Inventors: Stephen D. Holland; Charles L. Ingalls, both of Boise, Id.

[73] Assignee: Micron Technology, Inc., Boise, Id.

[21] Appl. No.: 485,804

[22] Filed: Jun. 7, 1995

Related U.S. Application Data

[63] Continuation of Ser. No. 115,487, Sep. 1, 1993, abandoned.

[51] Int. Cl.⁶ ........................................ G11C 7/00
[52] U.S. Cl. ................ 365/219; 365/220; 365/221; 365/236; 365/239
[58] Field of Search ............................ 365/219, 220, 365/221, 236, 189.12, 194, 239, 240

[56] References Cited

U.S. PATENT DOCUMENTS

| | | | |
|---|---|---|---|
| 4,484,187 | 11/1984 | Brown et al. | 340/703 |
| 4,498,155 | 2/1985 | Mohan Rao | 365/189 |
| 4,553,167 | 12/1985 | Kinoshita | 358/213 |
| 4,644,502 | 2/1987 | Kawashima | 365/219 |
| 4,648,077 | 3/1987 | Pinkham et al. | 365/240 |
| 4,734,880 | 3/1988 | Collins | 364/900 |
| 4,897,818 | 1/1990 | Redwine et al. | 365/221 |
| 4,941,127 | 7/1990 | Hashimoto | 365/189.1 |
| 4,987,559 | 1/1991 | Miyauchi et al. | 358/189.4 |
| 4,994,912 | 2/1991 | Lumelsky et al. | 358/140 |
| 5,224,072 | 6/1993 | Matsubara | 365/194 |
| 5,260,905 | 11/1993 | Mori | 365/230.5 |

*Primary Examiner*—David C. Nelms
*Assistant Examiner*—Son T. Dinh
*Attorney, Agent, or Firm*—Schwegman, Lundberg, Woessner & Kluth, P.A.

[57] ABSTRACT

An integrated circuit multiport memory supports synchronous access through a serial port. In operation, a multiport memory of the present invention is coupled to a free running clock signal and a clock enable signal for internally synchronizing serial access. The external clock enable signal prevents incrementing the sequence of serial access when serial access is interrupted. In a synchronous memory of the present invention, the write data signal need not be held after the active edge of the serial clock, since serial data hold time is made independent of serial access memory write timing parameters. When serial data signals are conveyed on a bidirectional line of a asynchronous serial data port of the present invention, a direction control circuit of the present invention is responsive to transfer and write enable signals and independent of the conventional serial output enable signal.

2 Claims, 4 Drawing Sheets

5,617,367

CONTROLLING SYNCHRONOUS SERIAL ACCESS TO A MULTIPORT MEMORY

This is a continuation of application Ser. No. 08/115,487 filed Sep. 1, 1993, now abandoned, entitled CONTROLLING SYNCHRONOUS SERIAL ACCESS TO A MULTIPORT MEMORY.

TECHNICAL FIELD

This invention relates to memory devices and to techniques for serial access to memory devices.

BACKGROUND

In numerous computing applications, systems designed to allow multiple processes to concurrently access the data stored in a shared memory outperform systems allowing only exclusive memory access. As an example, consider the cooperation of a computer and video display. As data stored in shared memory is created by the computer for display, the video display controller is repetitively accessing the shared memory for refreshing the display screen. When the shared memory includes multiport memory, random access by the computer and serial access by the display controller cooperate independently. Independent access eliminates the possibility of delaying the computing process or slowing the display process throughput due to conflicting needs for exclusive access.

System throughput for an asynchronous system design may exceed throughput of an equivalent synchronous system design, however, the synchronous system approach is generally less expensive to design, manufacture, and maintain. In a synchronous system design, the operations of logic circuits, processors, and memory coincide with a continuous, i.e. free running, system clock signal. Operations are begun after an active edge of the system clock signal and results are made available for further processing before the active edge of a subsequent period of the system clock signal. The system clock signal is simultaneously received by all data storage elements (flip-flops, registers, counters, etc.) to synchronize, i.e. to clock, the operations of individual elements of the system. Since signals subject to accumulated propagation delays through series logic elements are resynchronized between steps of a complex operation, the design need not be concerned with matching propagation path lengths, manufacturing can accommodate wider tolerances in individual device timing characteristics, and testing is simplified.

It is desirable to apply the benefits of synchronous design to applications for multiport memory. In conventional multiport memory such as video random access memory (VRAM), the serial port includes a serial clock signal, a bidirectional data signal line, and a serial output enable signal. When reading the serial port, a sequentially selected bit from a selected row of bits is provided on the data signal line for each serial clock signal received when the serial output is enabled. However, it is the system designer's responsibility to discontinue provision of the clock signal to discontinue serial read access. When writing the serial port, data on the bidirectional data signal line must be held substantially after the active edge of the serial clock. Synchronous systems providing the data signal are generally unable to hold a signal after the active edge of the system clock used as the serial clock signal. The conventional VRAM is, therefore, unsuited to synchronous design.

External circuitry for synchronizing the operation of a conventional VRAM serial port reduces throughput. An external gate in series with the serial clock signal is necessary to discontinue provision of a free running clock signal. By introducing an external gate in series with the system clock, the designer must accommodate the maximum propagation delay through the gate. Accommodating additional delay decreases throughput.

As an example of another computing application where it is desirable to use multiport memory in synchronous design, consider communications network nodes. Communications networks are conventionally serial to limit the number of connections, or channels, between communicating stations. At the conventional node, the communications data rate is considerably faster than the computing speed of the necessary logic or microprocessor circuits used to recognize the messages communicated. In such an application improved communications reliability is made possible by synchronizing the operation of the logic or microprocessor and the communications link. When the data rate greatly exceeds the computing speed, several conventional multiport memories must be combined in FIFO buffer and interleaved buffer designs. As a consequence of obtaining sufficient serial data rate capability, design costs increase due to complexity of the design involving several memories. Manufacturing costs increase due to increased connections, tighter timing margins, and complex tests. In addition, the cost of achieving high reliability increases dramatically.

In view of the problems described above and related problems that consequently become apparent to those skilled in the applicable arts, the need remains in numerous computing applications for a multiport memory operable from a free running system clock signal. Such applications include, for example, those involving video display, serial communication, and data storage.

SUMMARY

Accordingly, a multiport memory in one embodiment of the present invention includes a plurality of memory cells, a port for random access, and a port for synchronous serial access. In operation, such a multiport memory is responsive to a free running clock signal an enable signal, a disable signal, and a data signal for internally synchronizing serial access.

According to a first aspect of such a memory, the disable signal is coupled to a counter to prevent advancing the sequence by which bits are serially accessed when serial access is interrupted.

According to another aspect, the enable signal and the disable signal are received on a shared conductor to reduce the number of interface conductors and so reduce assembly costs for systems that use a memory of the present invention.

According to another aspect, the enable signal and the disable signal are two logic levels of a control signal. The control signal is combined with the clock signal to provide a gated serial clock signal. By including the clock gating circuitry in the memory design, the design of systems using such a memory are simplified.

According to yet another aspect, the data signal for writing a bit into the memory is delayed to preserve its synchronous relationship to the clock signal. The use of a delay simplifies systems design in that data hold time relative to the clock signal for a memory of the present invention is minimal.

According to still another aspect, serial access for read and for write operations share a bidirectional line for data signals. A direction control circuit of the present invention is responsive to a transfer signal and a write enable signal. By controlling direction according to read and write transfer operations, the conventional serial output enable signal is not required. Systems designed with a memory of the present invention, thus, use fewer signals so systems design is simpler.

According to another aspect, several functions cooperate for synchronous serial access via the serial port of an integrated circuit multiport memory including: (a) gating the clock, (b) maintaining the synchronous relationship between the clock and the input data signal, and (c) controlling the direction of serial data signalling on a bidirectional bus without use of an asynchronous serial output enable signal. Cooperation provides a packaged multiport memory with synchronous serial access having the same pin count as conventional packaged multiport memory.

The present invention may be practiced according to a method for writing a bit into a serial port of a multiport port memory. The serial port includes a control input, a clock input, and a data input. The method includes the steps of receiving an enable signal and a disable signal on the control input; receiving, at a first time, a clock signal on the clock input after the enable signal is received and before the disable signal is received; and receiving a data signal on the data input, the data signal conveying, at the first time, the bit to be stored.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a single line between functional blocks represents one or more signals including a group of signals that together signify a binary code. For example, a group of address lines represents a binary address at an instant in time. A horizontal or vertical bar represents a bidirectional bus. A line or a bar represents one or more conductors depending on the form of the signals conveyed between functional blocks.

Signals that appear on several figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. A person having ordinary skill in the art will recognize where portions of a diagram have been expanded to improve the clarity of the presentation. The vertical axis is intended to show the transition from active (asserted) to passive (non-asserted) levels of each logic signal. The voltages corresponding to the logic levels of the various signals are not necessarily identical among the various signals.

DESCRIPTION

Figure 1:
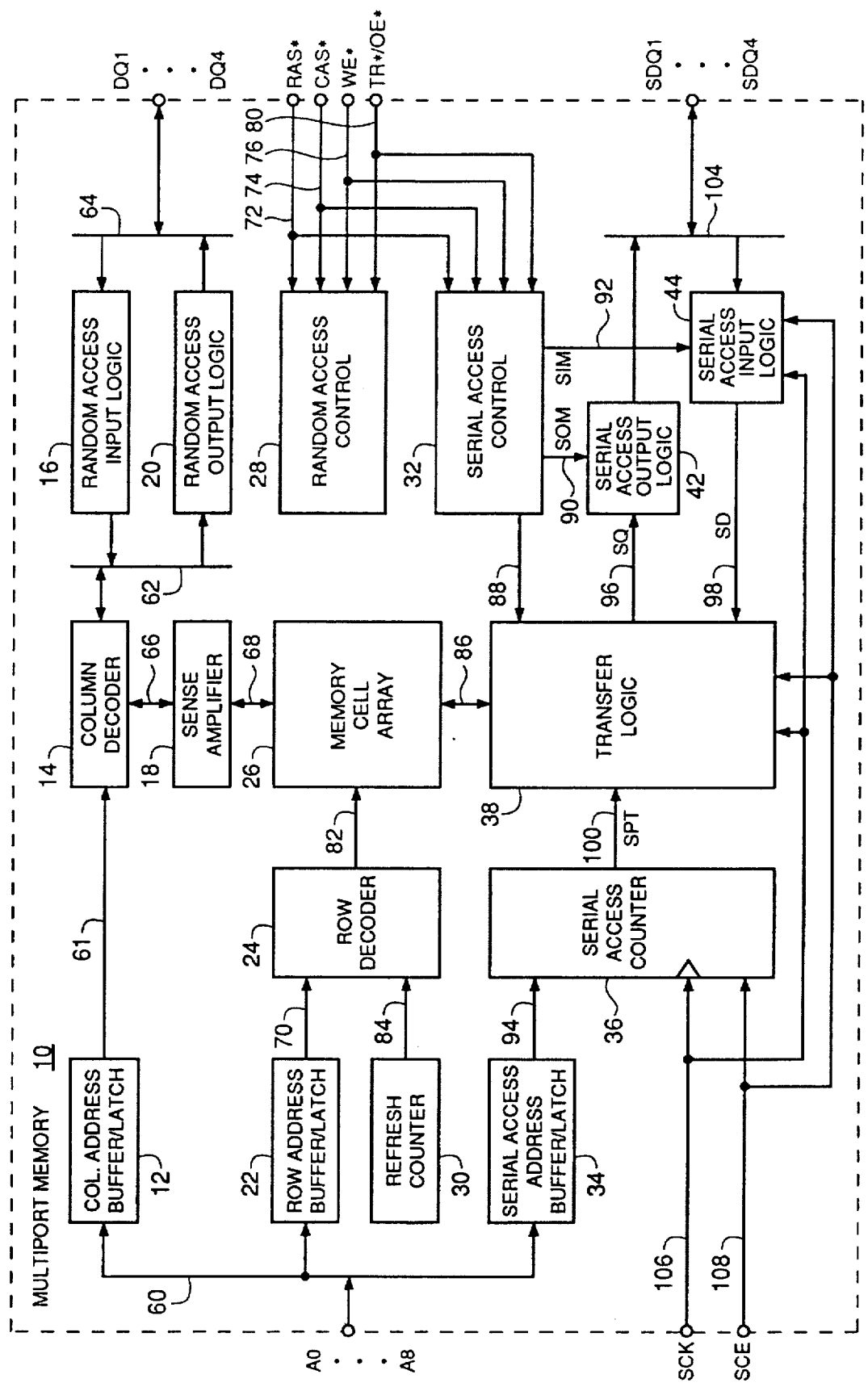
FIG. 1 is a functional block diagram of a multiport memory of the present invention.

FIG. 1 is a functional block diagram of a multiport memory of the present invention. Multiport memory 10 is formed as an integrated circuit. The memory includes an array of dynamic memory cells 26, means for random access 12–24 and 28, means for synchronous serial access 32–44, and means for refreshing the dynamic cells 24, 28, and 30.

The memory array is organized in rows and columns, with four bits stored at each row-column location. A so-called random access port is a group of signal lines sufficient for performing read and write operations on a randomly selected group of bits taken in parallel. The random access port of multiport memory 10 includes lines 60, 64, 72–76 and 80.

Multiport memory 10 also includes a serial access port which includes lines 72–80 and 104–108. Serial access control 32 coordinates the operation of serial access counter 36, transfer logic 38, output logic 42, and input logic 44. Cooperation of these blocks will be described in terms of a serial read operation and a serial write operation.

A serial read operation is generally preceded by a transfer of the bits from a row of cells of array 26 to transfer logic 38 where the bits are held in a register. Since memory cell array 26 is 4 bits (one nibble) deep, the register holds one nibble for each row position. Serial access control 32 generates serial read transfer signals on line 88 for loading the register. Serial access control 32, counter 36 and transfer logic 38 cooperate as means for selecting a nibble from the register. Serial access control logic 32 also generates serial output mode signal SOM on line 90 to enable serial access output logic 42.

Generally, serial read operations in a system using multiport memory 10 are conducted in a burst of back-to-back, uninterrupted operations. The transfer of a row of nibbles to transfer logic 38 and the loading of serial access counter 36 with an appropriate starting value precede serial output operations. The starting value for counter 36 is received on line 60, held in serial access address buffer/latch 34, and conveyed on line 94 to the counter for loading.

Counter 36 responds to serial clock signal SCK on line 106 and serial clock enable signal SCE on line 108 for counting and, in some cases, loading. Counter 36 provides a binary count shown as serial pointing signal SPT on line 100. Transfer logic 38 responds to signal SPT by providing on line 96 the nibble at the row position identified by signal SPT. The nibble on line 96 is represented as signal SQ that is input to serial access output logic 42. Output logic 42 couples signal SQ onto bidirectional bus 104 as signal SDQ1–SDQ4 when enabled by serial output mode signal SOM on line 90.

Counter 36 and transfer logic 38 cooperate as sequencing means for accessing the content of memory cell array 26. Signals for selecting in sequence a next nibble of cells include signal SPT on line 100.

After a logic high on serial clock enable signal SCE on line 108 is received, subsequent reception of serial SCK on line 106 causes counter 36 to increment, signal SPT to identify a next nibble in sequence, and this next nibble to be provided on line 96. The serial read operation continues for each active transition of signal SCK until sequencing is disabled. In multiport memory 10, sequencing is disabled by a disable signal received on line 108. When serial clock enable signal SCE is logic low, clock signal SCK is disabled, i.e. no longer coupled for causing the sequence of nibble selection to advance.

A serial write operation generally includes two phases. In a first phase, a large number of back-to-back, i.e. uninterrupted, write operations store one nibble at a time in a register in transfer logic 38. In a second phase, the contents of the register is written to a row in memory cell array 26. Serial access control 32 generates serial input mode signal SIM on line 92 to enable serial access input logic 44. During the second phase, serial access control 32 generates serial write transfer signal SWT on line 88 for writing nibbles into memory cell array 26.

During the first phase, counter 36 operates as described above, loading a starting position and incrementally identifying sequential row positions in a register within transfer logic 38. After an enable signal is received, i.e. a logic high on serial clock enable signal SCE on line 108, subsequent reception of signal SCK on line 106 causes counter 36 to increment, signal SPT to identify a next position in sequence, and a nibble, received on bus 104 to be latched in the register. Write operations continue for each active transition of signal SCK until sequencing is disabled. In multiport memory 10, sequencing is disabled by a disable signal received on line 108. When serial clock enable signal SCE is logic low, clock signal SCK no longer causes the sequence of nibble selection to advance.

In the second phase of a serial write operation, serial access control 32 generates serial write transfer signal SWT on line 88. Timing of signal SWT is coordinated by signals, not shown, provided by random access control 28 to avoid conflicting simultaneous operations on memory cell array 26. The cooperation of signals used to access the memory via the random access port and the serial access port are better understood from a timing diagram.

Figure 2:
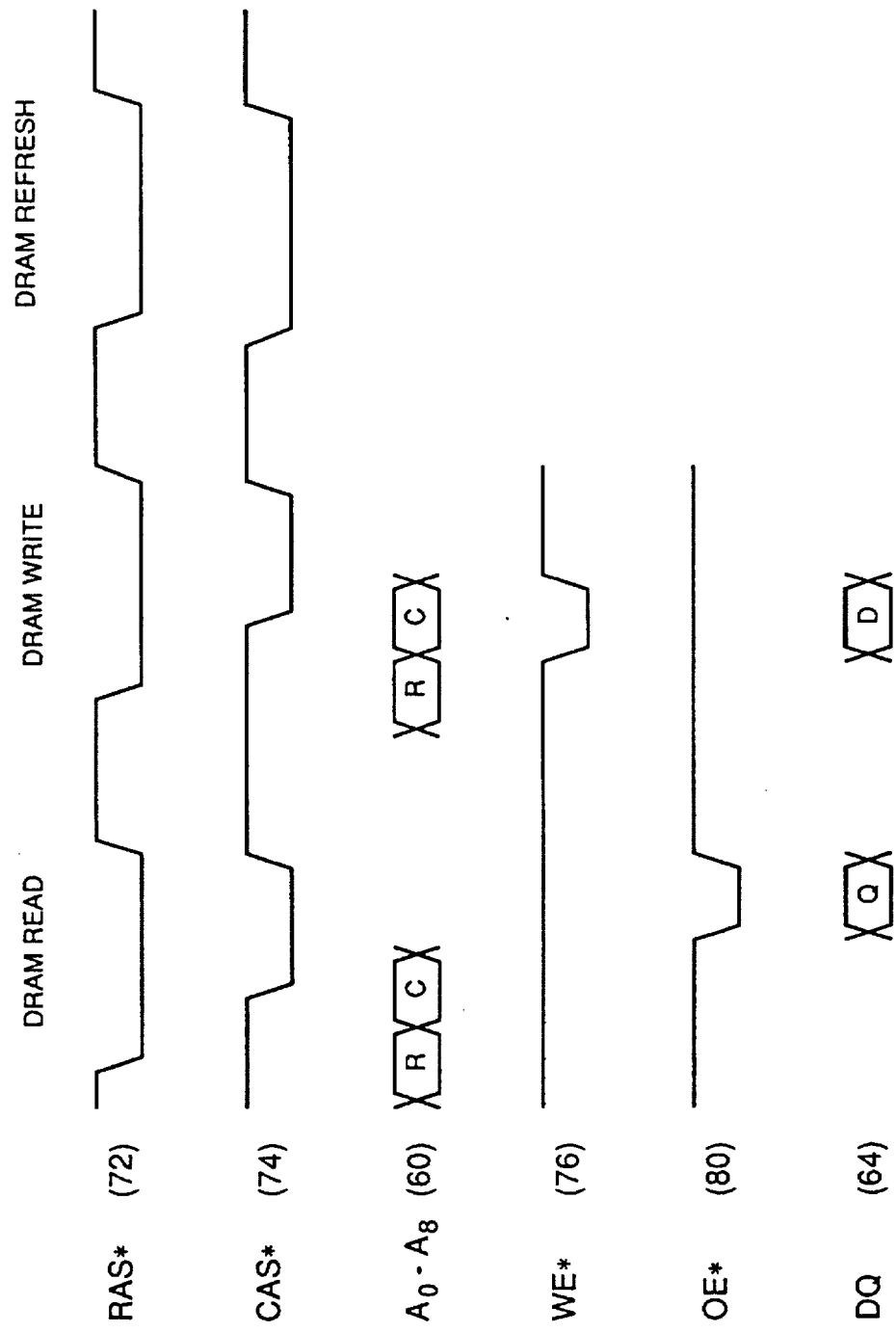
FIG. 2 is a timing diagram illustrating random access operations of the multiport memory shown in FIG. 1.

FIG. 2 is a timing diagram illustrating random access operations of the multiport memory shown in FIG. 1. Three operations are illustrated: a dynamic random access (DRAM) read cycle, a write cycle, and a refresh cycle with reference to both figures. The read and write cycle begin with a common addressing sequence.

Row address strobe RAS* on line 72 falls at a time when address signals A0–A8 on bus 60 identify the row to be accessed. The row address is latched by row address buffer/latch 22 and provided in binary on line 70 to row decoder 24. Row decoder 24 provides a signal on lines 82 for selecting one row of memory cell array 26 for accessing. Column address strobe CAS* on line 74 falls at a subsequent time when address signals A0–A8 identify the column to be accessed. The column address is latched by column address buffer/latch 12 and provided in binary on line 61 to column decoder 14. Column decoder 14 enables passage of data signals between bus 62 and one column of memory cell array 26 for accessing.

When output enable signal OE* on line 80 is low before the rising edges of CAS* and RAS*, a nibble, read from the addressed row and column of memory cell array 26, is provided through random address output logic 20 to bus 64 as signals DQ1–DQ4. When write enable signal WE* on line 76 is low during the time the column address is received, signals DQ1–DQ4 are received through random access input logic 16 as a nibble to be written into the addressed row and column of memory cell array 26.

Dynamic memory requires refreshing to retain data stored therein. A CAS*-before-RAS* refresh cycle is shown in FIG. 2. Memory cell array 26 is refreshed a row at a time. Each row to be refreshed is identified by refresh counter 30 in cooperation with random access control 28.

Figure 3:
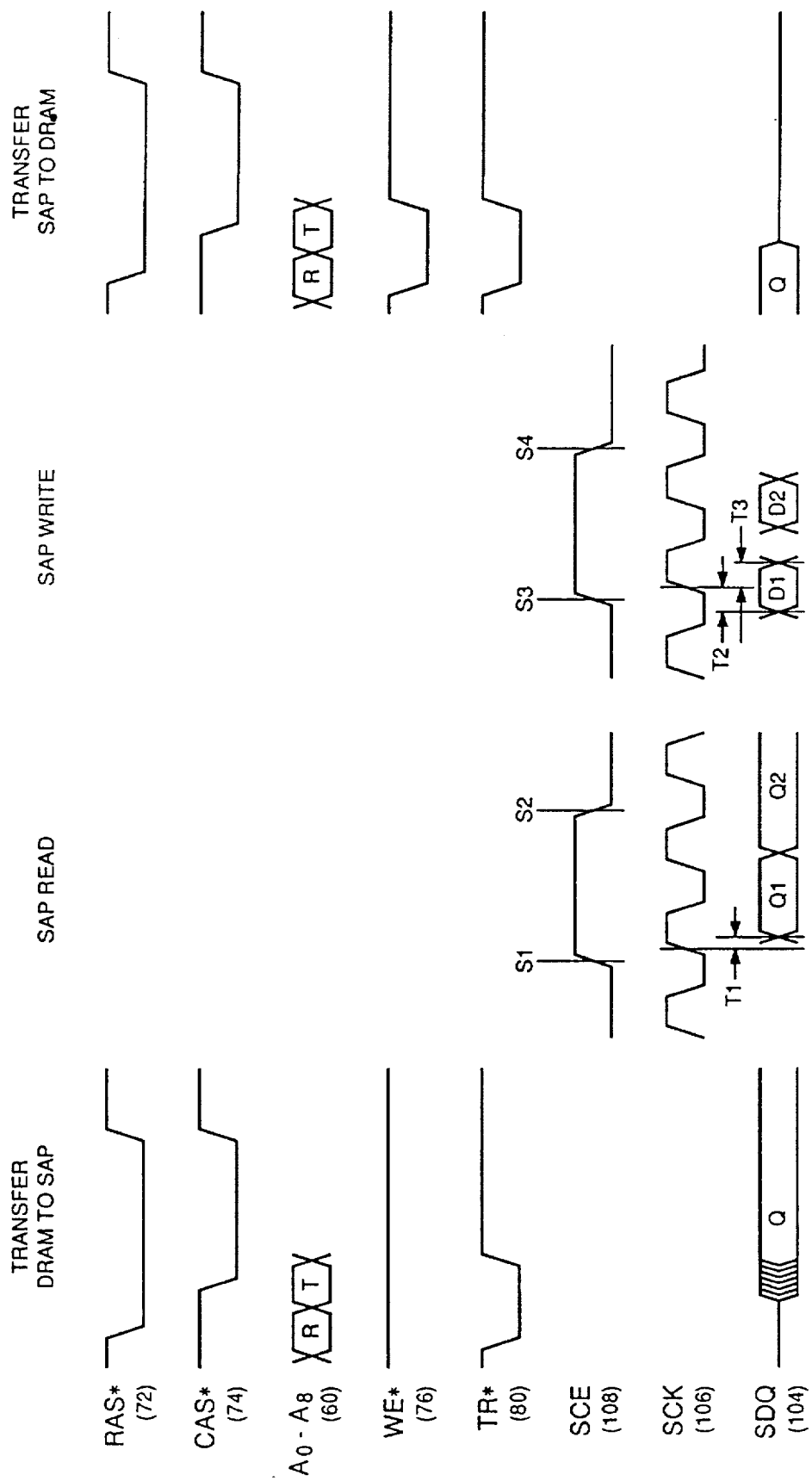
FIG. 3 is a timing diagram illustrating serial access operations of the multiport memory shown in FIG. 1.

FIG. 3 is a timing diagram illustrating serial access operations of the multiport memory shown in FIG. 1. Four cycles are illustrated: a read transfer cycle from dynamic random access memory (DRAM) to serial access port (SAP), a serial access read cycle, a serial access write cycle, and a write transfer cycle from serial access port to DRAM.

In a read transfer cycle from DRAM to serial access port, row address strobe RAS* on line 72 falls at a time when address signals A0–A8 on bus 60 identify the row to be addressed and transfer signal TR* on line 80 is low. The row address is latched by row address buffer/latch 22 and provided in binary on line 70 to row decoder 24. Row decoder 24 provides a signal on lines 82 for selecting one row of memory cell array 26 for accessing. Column address strobe CAS* on line 74 falls at a subsequent time when address signals A0–A8 identify the starting row position, i.e. the tap address, for the serial output sequence. The position is latched by serial access address buffer/latch 34 and conveyed on line 94 for loading serial access counter 36. In response to RAS* falling while transfer signal TR* is logic low, serial access control 32 generates serial output mode signal SOM on line 90, enabling output logic 42 for providing signals SDQ1–SDQ4 on bidirectional bus 104. If serial access control 32 were in serial input mode prior to the read transfer cycle, serial access control 32 begins and maintains serial output mode for the read transfer cycle and until a write transfer cycle is performed.

Having established the serial input mode, signals SCE and SCK coordinate subsequent serial access read cycles. In a serial access read cycle, serial clock enable signal SCE on line 108 rises at time S1 prior to the active edge of serial clock signal SCK on line 106. Signals SDQ1–SDQ4 representing a first nibble are provided on line 104 after an access time T1 from the active edge of signal SCK, thus, completing a read cycle. Any number of serial access read cycles may follow the first while signal SCE is maintained logic high. As shown a next nibble in sequence is provided after a similar access time from the subsequent active edge of signal SCK. At time S2, signal SCE falls; yet signals SDQ1–SDQ4 are continuously provided and the serial port remains in output mode.

Prior to performing a serial write cycle, the serial port must be in serial input mode. Changing the mode from serial output mode to serial input mode will be discussed below with reference to the write transfer cycle from serial port to DRAM. For simplicity of discussion, assume that serial input has been established. Performance of a serial access write cycle is coordinated by signals SCE and SCK.

In a serial access write cycle, serial clock enable signal SCE on line 108 rises at time S3 prior to the active edge of serial clock signal SCK on line 106. Signals SDQ1–SDQ4 representing a first nibble are input on line 104 a setup time T2 before the active edge of signal SCK, and held a hold time T3 after the active edge of signal SCK, thus, completing a write cycle. Any number of serial write cycles may follow the first while signal SCE is maintained logic high. Nibbles are stored at sequential positions in a register within transfer logic 38 as already discussed. As shown, a next nibble in sequence is received after a similar setup and hold time about the subsequent active edge of signal SCK. At time S4, signal SCE falls; yet serial access input logic 44 remains enabled to receive input signals SDQ1–SDQ4 and the serial port remains in input mode.

In a write transfer cycle from serial access port to DRAM, the contents of the register within transfer logic 38 is written to memory cell array 26 and the serial port is preconditioned for subsequent serial write cycles. Hence, an initial transfer cycle from serial access port to DRAM is necessary to escape from serial output mode so that serial write cycles can be performed.

In a write transfer cycle from serial port to DRAM, row address strobe RAS* on line 72 falls at a time when address signals A0–A8 on bus 60 identify the row to be accessed. The row address is latched by row address buffer/latch 22 and provided in binary on line 70 to row decoder 24. Row decoder 24 provides a signal on lines 82 for selecting one row of memory cell array 26 for accessing. Column address strobe CAS* on line 74 falls at a subsequent time when address signals A0–A8 identify the starting row position, i.e. the tap address, for a subsequent serial write cycle. The position is latched by serial access address buffer/latch 34 and conveyed on line 94 for loading serial access counter 36. When transfer signal TR* on line 80 falls while CAS* is logic low, serial access control 32 generates serial input mode signal SIM on line 92, enabling input logic 44 for receiving signals SDQ1–SDQ4 on bidirectional bus 104. If serial access control 32 were in serial output mode prior to the read transfer cycle, serial access control 32 begins and maintains serial input mode for the write transfer cycle and until a read transfer cycle is performed.

Multiport memory 10 is well suited for operation in a system based on synchronous design. In one embodiment of a system designed to use multiport memory 10, the access timing is synchronous and matches a peripheral circuit. Data exchange with the peripheral circuit is discontinuous. In one case wherein the peripheral includes a communications transceiver, interruptions are due to message retransmission and similar delays. In another case wherein the peripheral includes rotating storage, interruptions are due to the slower responsiveness of mechanical systems. Synchronous design using multiport memory 10 is facilitated in these complex applications because the serial data rate is high and variable.

High serial data rate is a consequence of minimum input data hold time. Hold time T3 is minimal for multiport memory 10 so that the serial input data rate is not substantially reduced by hold time requirements. By maintaining the synchronous relationship between data and clock signals as each propagates through memory 10, hold time T2 is minimized.

Variable serial data rate provides design flexibility and supports synchronous design rules. By controlling signal SCE on line 108, the data rate on line 104 for read and write operations can be varied from a static rate to the rate of signal SCK. The resulting variable rate is synchronous, being related to a multiple of the period of signal SCK. The serial port of multiport memory 10 is operable with the system clock directly. A conventional memory having an asynchronous serial port cannot be used as a synchronous device without externally gating or dividing the system clock to provide a serial clock signal. Gating and dividing degrade clock distribution by introducing skew between devices intended to be simultaneously clocked. These techniques, therefore, constitute a violation of synchronous design rules.

By avoiding external clock gating circuitry, synchronous designs achieve reliable high performance. System performance is compromised when allowance must be made for skew arising from external clock gating and the distribution of multiple clock signals in a system. Propagation delays that would otherwise cause skew are compensated in memory 10 in ways best understood by a discussion of particular embodiments with reference to schematic diagrams.

Figure 4:
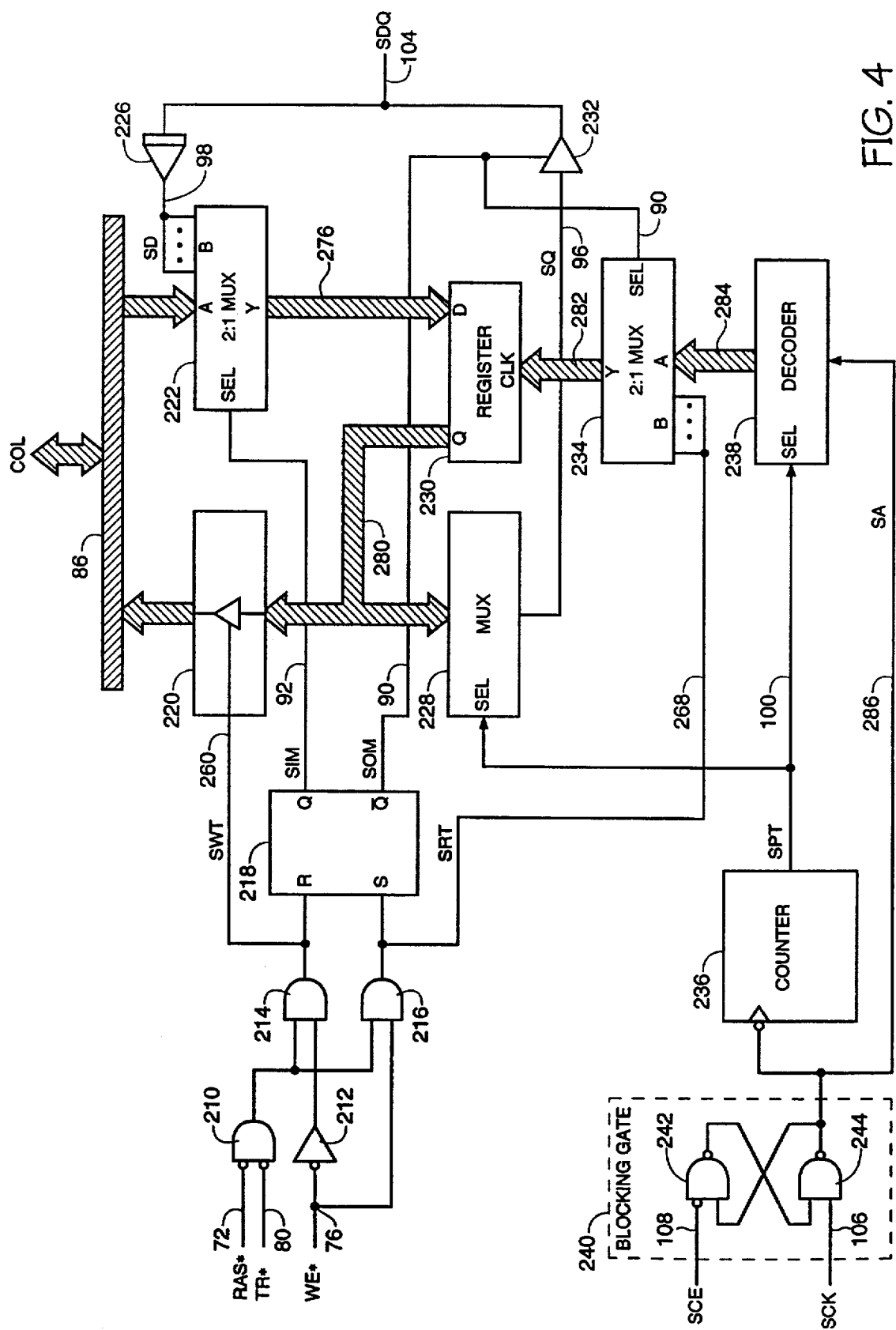
FIG. 4 is a functional block diagram of a portion of transfer logic 38 and related circuitry shown in FIG. 1.

FIG. 4 is a functional block diagram of a portion of transfer logic 38 and related circuitry shown in FIG. 1. The serial access operations described with reference to FIG. 3 are performed by the circuitry shown. The control logic and signals will be described after the read and write cycle data paths have been identified.

In a read data transfer from DRAM to SAP, a row of data from memory columns is conveyed on column bus 86 through multiplexer 222 and latched in register 230. The content of register 230 in a serial read operation is conveyed on bus 280 to multiplexer 228 where one nibble is selected for output through tristate buffer 232 and provided as signal SDQ on bus 104.

In a serial write operation, data received on bus 104 is delayed through delay element 226 and coupled through multiplexer 222 to be latched at one position of register 230. Register 230 contents representing a row of data for storage in the memory array are conveyed on bus 280 in a write transfer cycle from SAP to DRAM through tristate buffers 220 onto column bus 86.

Gates 210–216 and flip-flop 218 cooperate as direction control means for providing data path direction signaling. Gates 210–216 cooperate as a control circuit for changing the content of flip-flop 218 which serves as a mode register. Two directions of data transfer distinguish read operations from write operations and define one of two modes of operation as serial input mode or serial output mode. The mode of operation corresponds to the binary state of flip-flop 218 which maintains the direction signal. Serial read transfer signal SRT on line 268, serial write transfer signal on line 260, serial input mode signal SIM on line 92 and serial output mode signal SOM on line 90 cooperatively provide a direction signal consistent with the state of flip-flop 218.

Flip-flop 218 is reset when transfer signal TR* is received with row address strobe signal RAS* low and write enable WE* low. When reset, serial output mode is established. Signal SIM on line 92 is low for controlling multiplexer 222 so that column bus 86 is coupled on line 276 to register 230. Signal SOM on line 90 is high to couple all clock inputs of register 230 to signal SRT on line 268 through multiplexer 234. Also in serial output mode, tristate buffer 232 is enabled by signal SOM on line 90 to couple signal SQ on line 96 to line 104.

Flip-flop 218 is set when row address strobe signal RAS* is received with transfer signal TR* low and write enable signal WE* high. When set, serial input mode is established. Signal SIM on line 92 is high for controlling multiplexer 222 so that input signal SDQ on line 104 is coupled to every position of register 230. The means by which only one position of register 230 is written will be discussed below. Signal SOM on line 90 is high for controlling multiplexer 234 so that clock signals on line 284 are coupled to register 230 clock inputs via line 282.

Counter 236 provides a binary count as serial pointer signal SPT on line 100. Counter 236 is coupled to signal SCK on line 106 for incrementing in response to serial access signal SA on line 286. The incremented binary count is used to identify a consecutive sequence of row positions beginning from an initially loaded value, the tap position. Incrementing is responsive to active edges of signal SCK on line 106 when signal SCE on line 108 is high.

Counter 236 is enabled by a serial access signal on line 286 provided by blocking gate 240. Blocking gate 240 responds to signals on lines 106 and 108 to provide an output signal on line 286 as the logic AND of the input signals. AND gates 242 and 244 operate as a blocking flip-flop so that a rising edge on signal SCE is not coupled to counter 236 as a serial access signal. When serial clock enable signal SCE on line 108 is logic low, serial clock signal SCK on line 106 has no effect on counter 236. However, when SCE is logic high, SCK is coupled through blocking gate 240 and clocks counter 236. Signals on line 286 are delayed from signals on line 106 by the propagation delay of blocking gate 240.

Delay element 226 couples signal SDQ input on line 104 to the D input of register 230 with a propagation delay that closely matches the propagation delay through blocking gate 240, decoder 238, and multiplexer 234. By delaying the signal at the D input, the timing relation between signals on lines 276 and 282 will correspond to the timing relation between signals on lines 104 and 106. Hence, the setup and hold times discussed with reference to a serial write cycle shown on FIG. 3 correspond to the setup and hold characteristics of register 230. Without delay element 226, the hold time requirement for T3 on FIG. 3 would be extended by the difference between the propagation delays of two coupling circuits. The first coupling circuit includes delay element 226 and multiplexer 222. The second coupling circuit includes blocking gate 240, decoder 238, and multiplexer 234.

Tristate buffer 232 is enabled and disabled by signal SOM on line 90. When disabled by a logic low on line 90, tristate buffer output on line 104 is high impedance, i.e. an off condition, so as not to interfere with data signals input on bidirectional bus 104. When enabled by a logic high on line 90, tristate buffer output provides signal SDQ on line 104 in response to signal SD on line 96.

The foregoing description discusses preferred embodiments of the present invention, which may be changed or modified without departing from the scope of the present invention.

For example, those skilled in the art will understand that the logical elements described above may be formed using a wide variety of logical gates employing any polarity of input or output signals and that the signals described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention.

These and other changes and modifications are intended to be included within the scope of the present invention. While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

For example, multiport memory 10 is a dynamic read/write memory organized one nibble deep. Alternate and equivalent embodiments include a memory cell array 26 that is static, read only, organized with a different number of bits deep, and a combination of such features.

As shown, means for accessing a selected cell includes a counter and decoder/multiplexer circuitry. In an alternate and equivalent embodiment, the counter is nonmonotonic. As is well known, sequences can also be represented without a counter. Alternate and equivalent embodiments for accessing a selected cell include one or more of the following: a shift register, transfer gates, and state machine circuitry.

In a first embodiment using shift register circuitry for selecting a cell, register 230 is replaced by a shift register, and decoder/multiplexers 222, 228, 234, and 238 may be eliminated. The content of register 230 is rotated when the serial access signal is received.

In a second embodiment, multiplexer 228 is replaced with a bank of AND gates enabled by bits of a shift register. The pattern rotated in the shift register identifies the next sequential position in register 230 used for providing the SQ signal on line 96. In a variation of this embodiment, more than one position is identified for logic combination to provide signal SQ on line 96.

Decoding and multiplexing are equivalently performed using memory devices for table look-up. Selecting is performed in alternate and equivalent embodiments, for example, by signal routing, selective coupling, selective signal blocking, and related techniques.

As shown a serial access signal is developed by the AND combination of a clock signal (SCK) and a clock control signal (SCE). Alternate and equivalent embodiments identify a cell for access using circuits responsive to the clock signal and clock control 'signal directly without the formation of an intermediate serial access signal.

As shown, register 230 latches a signal at its D input when a signal at its clock input is received. Means for storing a signal include in one embodiment register 230 and in other equivalent embodiments include for example a latch, a flip-flop, a circuit having cross coupled transistors, a memory device, or a storage cell. Similar equivalents are used in alternate and equivalent embodiments of flip-flop 218 for latching the direction, i.e. mode, signal.

Means for maintaining the timing relationship between clock and data signals until the data signal is latched, as shown, include delay element 226 and register 230. In a preferred embodiment, an additional latch is introduced between bus 104 and multiplexer 222, the latch clock input being coupled to signal SCK. The setup and hold times T2 and T3 on FIG. 3 for this alternate embodiment are related to the characteristics of the additional latch. Consequently the design of register 230 may be simplified for space and cost savings benefits.

Transfer means for transferring in a first and a second direction, as shown for memory 10, includes functions and circuitry shown in FIG. 4. In alternate and equivalent embodiments, transfer means includes, for example, means for masked transfers, split transfers, and pseudo write transfers as is well known in the art.

Bidirectional signalling, as shown, includes tristate buffer circuitry. Open collector and open drain circuitry are functionally equivalent to tristate buffer circuitry. In an alternate embodiment for supporting systems that employ two opposite system clock signals, bidirectional signalling is performed in response to one of the two system clock signals. In FIG. 4, bi-phase clocking of bidirectional bus 104 is supported in one alternate embodiment of memory 10 by introducing an AND gate between line 90 and the control input of tristate buffer 232. The additional gate enables buffer 222 in response to the logic AND of signals SOM and SCK. In a system using two of these alternate embodiments of memory 10, one memory receives the first system clock signal on line 106, and the other memory receives the opposite system clock signal on line 106.

The words and phrases used in the claims are intended to be broadly construed. An "integrated circuit" refers generally to semiconductor and photolihographic apparatus and includes but is not limited to a packaged integrated circuit, an unpackaged integrated circuit, a combination of packaged or unpackaged integrated circuits or both, wafer scale integration, a hybrid package of circuits, a microprocessor, a microcontroller, a peripheral controller, a cache, a microcode store, an integrated memory module, a charge-coupled device, combinations thereof, and equivalents.

A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." The measure may be instantaneous or an average. For a simple binary digital signal, the two characteristic values are called logic levels, "high" and "low." Digital circuitry is often designed to be responsive to a "transition" signal defined to occur when the logic level of a digital signal changes between characteristic values. Complex binary digital signaling includes conveying a binary code at an instant in time on a group of conductors.

What is claimed is:

1. A serial synchronous memory circuit responsive to an external continuous clock signal having an active edge and an external enable signal, comprising:

a plurality of memory cells arranged in at least one row and at least one column;

means for random read and write access of the plurality of memory cells;

a parallel port connected to the means for random read and write access;

a clock input capable of receiving continuous clock signal and a clock enable input connected to gate the clock input signal and capable of receiving the external enable signal;

a counter connected to the clock input and enable input, the counter having an output which produces a count value in response to the external continuous clock signal on the clock input and the external clock enable signal on the clock enable input;

a register connected to the counter and to at least one column of the plurality of memory cells;

a delay element connected between a serial port and the register and having a delay value selected to synchronize the active edge of the external continuous clock signal with data values of a serial data signal on the serial port;

serial control means connected to the register and responsive to a first direction signal for shifting the data values into the register from the delay element port in response to the count value and in synchrony with the external continuous clock signal and for loading the data values into the plurality of memory cells, and;

the serial means further responsive to a second direction signal for shifting the contents of the register out the serial port in response to the count value and in synchrony with the external continuous clock signal.

2. A method of controlling a serial synchronous memory, comprising the steps of:

receiving a continuous external clock signal with an external clock enable signal to produce a gated internal clock signal;

counting in response to the gated internal clock signal to produce a count value;

receiving a serial data signal;

delaying the serial data signal to produce a delayed serial data signal synchronized to the external continuous clock signal;

serial loading the delayed serial data signal into a register to produce a loaded data signal; and parallel storing the loaded data signal into one row of memory cell array.

\* \* \* \* \*

UNITED STATES PATENT AND TRADEMARK OFFICE
CERTIFICATE OF CORRECTION

PATENT NO. : 5,617,367

DATED : April 1, 1997

INVENTOR(S) : Holland et al.

It is certified that error appears in the above-identified patent and that said Letters Patent is hereby corrected as shown below:

On the title page, item [63], and
    column 1, line 4, delete "Ser. No. 08/115,487 filed Sep. 1, 1993" and insert --thereto - U.S. Patent No. 5,524,098 issued June 4, 1996.-- therefor.

On column 12, line 27, delete "signal" and insert --signal;-- therefor.

On column 12, line 27-29 delete "with an external clock enable signal to produce a gated internal clock signal;

On column 12, after line 27, insert --gating the continuous external clock signal with an external clock enable signal to produce a gated internal clock signal;

Signed and Sealed this

Seventh Day of October, 1997

*Attest:*

BRUCE LEHMAN

*Attesting Officer*    *Commissioner of Patents and Trademarks*